(12) United States Patent
Ueda

(10) Patent No.: US 7,795,699 B2
(45) Date of Patent: *Sep. 14, 2010

(54) SEMICONDUCTOR DEVICE

(75) Inventor: Takehiro Ueda, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/865,796

(22) Filed: Jun. 14, 2004

(65) Prior Publication Data

US 2004/0262710 A1  Dec. 30, 2004

(30) Foreign Application Priority Data

Jun. 26, 2003 (JP) ............................. 2003-183369
Jun. 7, 2004 (JP) ............................. 2004-168131

(51) Int. Cl.
*H01L 29/00* (2006.01)
(52) U.S. Cl. .................. 257/529; 257/209; 257/665
(58) Field of Classification Search ................ 257/209, 257/529, 665
See application file for complete search history.

(56) References Cited

U.S. PATENT DOCUMENTS

| 4,064,493 A | 12/1977 | Davis |
| 5,420,456 A | 5/1995 | Galbi et al. |
| 5,472,901 A * | 12/1995 | Kapoor ..................... 438/601 |
| 5,780,918 A * | 7/1998 | Aoki ......................... 257/529 |
| 5,949,323 A * | 9/1999 | Huggins et al. ........... 337/401 |
| 6,500,722 B2 * | 12/2002 | Wada et al. ............... 438/381 |
| 6,753,210 B2 * | 6/2004 | Jeng et al. ................. 438/132 |
| 7,061,070 B2 * | 6/2006 | Ikegami ..................... 257/529 |

FOREIGN PATENT DOCUMENTS

| JP | 58-133738 | 8/1983 |
| JP | 62-246220 | 10/1987 |
| JP | 03-044063 | 2/1991 |
| JP | 03-028737 | 3/1991 |
| JP | 04-033230 | 2/1992 |
| JP | 04-218935 | 8/1992 |
| JP | 10-093027 | 4/1998 |
| JP | 11-317145 | 11/1999 |
| JP | 2002-197884 | 7/2002 |
| JP | 2004-031536 | 1/2004 |

OTHER PUBLICATIONS

Japanese Patent Office issued a Japanese Office Action dated Mar. 2, 2010, Application No. 2004-168131.
Japanese Patent Office issued a Japanese Office Action dated Jun. 15, 2010, Application No. 2004-168131.

* cited by examiner

*Primary Examiner*—Ori Nadav
(74) *Attorney, Agent, or Firm*—Young & Thompson

(57) ABSTRACT

The semiconductor device of the present invention comprises a semiconductor substrate; and a conductive element formed on the semiconductor substrate and capable of being opened when a predetermined current flows, wherein the conductive element turns plurality of times.

36 Claims, 19 Drawing Sheets

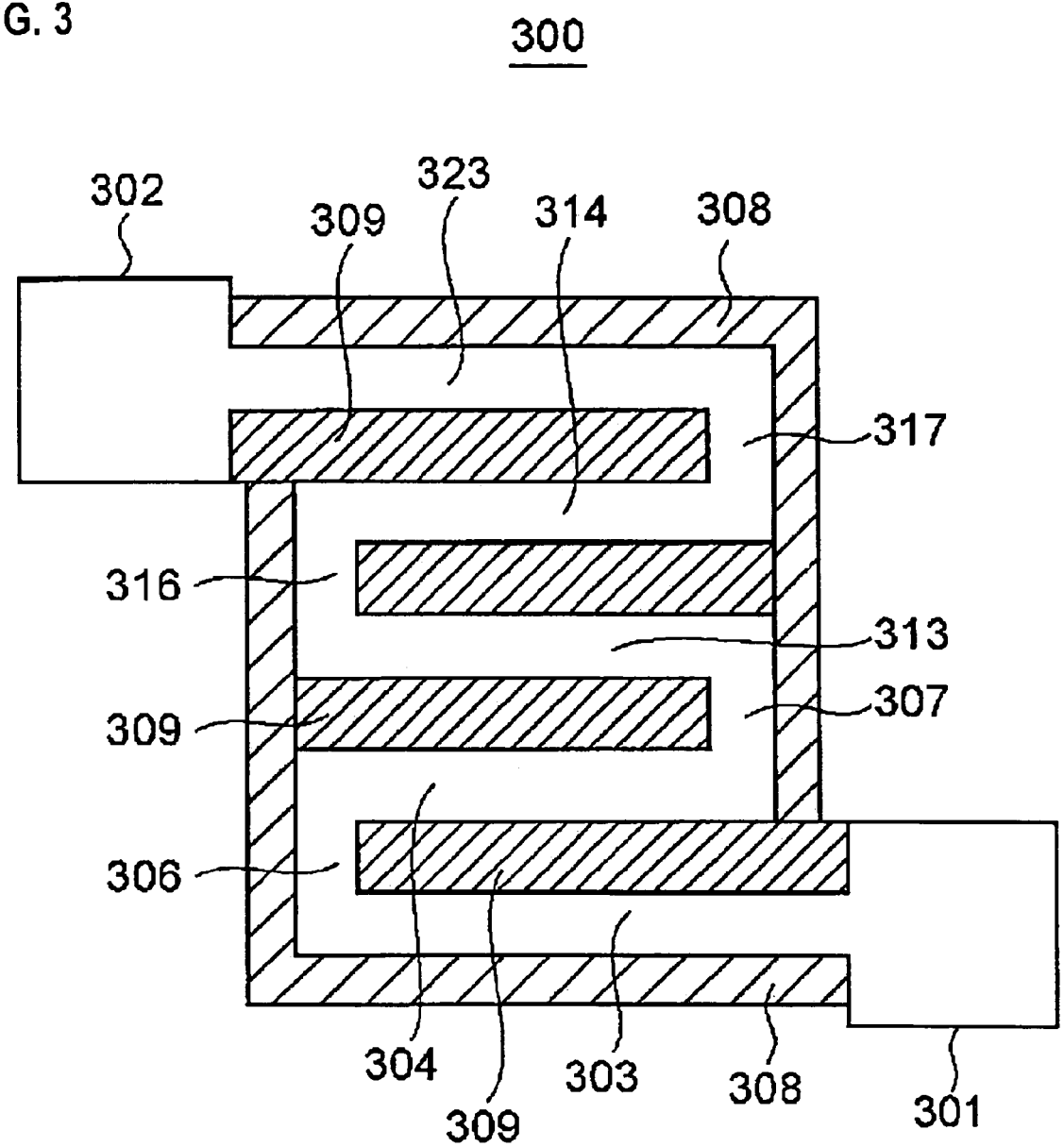

SEMICONDUCTOR DEVICE

This application is based on Japanese patent applications NO.2003-183369 and NO.2004-168131, the content of which are incorporated herein by reference.

BACKGROUND OF THE INVENTION

1. Field of the Invention

The present invention relates to a semiconductor device, and more particularly to a semiconductor device including a fuse.

2. Description of the Related Art

When a semiconductor device includes fuses, it is possible to adjust the resistance value by opening some of the fuses, or alternating a defective element to a functional element by opening one of the fuses connected to the defective element. This method of alternating the defective element to the functional element is applied to a semiconductor device having redundancy. Conventionally, it is common to open the fuses by laser irradiation. However, there are some problems in opening the fuses by the laser irradiation.

Firstly, in order to avoid damage to elements other than the fuse when the fuse is opened, the portion to be opened in the fuse has to be placed with a predetermined space from the elements. Thus, the size of the semiconductor device is increased.

In addition, in order to form a fuse to be opened by the laser irradiation, additional photolithography processes are necessary. Usually, an insulating layer is formed on a fuse. Thus, an additional step to adjust the thickness of the insulating layer to form an opening above the fuse for laser irradiation is necessary. In addition, when the semiconductor device including a fuse is examined, the following three steps are necessary. Firstly, electrical properties of the device are examined, then, the fuse is opened, and finally, electrical properties are examined again. Thus the manufacturing processes for the semiconductor device are increased and makes the cost of manufacturing the semiconductor device is greater.

In order to solve the problem caused by the laser irradiation, there have been attempts to open the fuses by current flow. For example, Japanese patent application NO.2002-197884 discloses a fuse that is opened by current flow. In this application, a part of the fuse is made narrow, or the fuse includes an angled portion to promote blowout of the fuse.

SUMMARY OF THE INVENTION

However, the inventor of the present invention found that the fuse disclosed in the above application still has a problem in that a large amount of current or voltage is required to open the fuse.

The present invention has been conceived in view of the foregoing situation, with the object of providing a semiconductor device including a fuse which needs less current or voltage to be opened compared with a conventional fuse.

According to the present invention, there is provided a semiconductor device comprising: a semiconductor substrate; and a conductive element formed on the semiconductor substrate and capable of being opened when a predetermined current flows, wherein the conductive element turns plurality of times.

Here, "a conductive element capable of being opened when a predetermined current flows" is a fuse. The word "turn" or the word "turning" means that at which the conductive line rotates more than 90 degrees.

As the conductive element turns plurality of times, the conductive element can be formed such that the center portion of the conductive element is surrounded by the rest portions of the conductive element. With this structure, the center portion of the conductive element is heated by the rest portions thereof. Thus, the center portion of the conductive element can be kept relatively high temperature so that the conductive element is easily opened when a predetermined current flows therethrough.

The conductive element may include a first one way linear portion which extends in a first direction, an another way linear portion which extends in a second direction which is substantially opposite direction to the first direction, and a second one way linear portion which extends in the first direction. The first one way linear portion, the another way linear portion, and the second one way linear portion may be positioned parallel to each other and electrically connected with each other.

With this structure, either one of the first one way linear portion, the another way linear portion, and the second one way linear portion is placed to be surrounded by the other portions. Thus, the portion surrounded by the other portions can be kept relatively high temperature. Therefore, the conductive element is easily opened when a predetermined current flows therethrough.

The conductive element may include a first one way linear portion which extends in a first direction, an another way linear portion which extends in a second direction which is substantially opposite direction to the first direction, a second one way linear portion which extends in the first direction, a first connecting portion which connects one of the edges of the first one way linear portion and one of the edges of the another way linear portion, and a second connecting portion which connects the other of the edges of the another way linear portion and one of the edges of the second one way linear portion. The first one way linear portion, the another way linear portion, the second one way linear portion, the first connecting portion, and the second connecting portion may be electrically connected with each other.

The conductive element may include a plurality of first linear portions positioned parallel to each other and each of which extends in a first direction, and a plurality of second linear portions positioned parallel to each other and each of which extends in a second direction which is different from the first direction. The plurality of first linear portions and the plurality of second linear portions may be placed such that at least one of the plurality of first linear portions or at least one of the plurality of second linear portions is surrounded at four sides by the rest of the plurality of first linear portions and the plurality of second linear portions.

With this structure, the linear portion which is surrounded by the other linear portions at four sides can be kept relatively high temperature. Thus, the conductive element is easily opened at the linear portion which is surrounded by the other linear portions when a predetermined current flows therethrough.

The plurality of first linear portions and the plurality of second linear portions may be placed such that the current respectively flow toward different directions in the first linear portions adjacent to each other, and the current respectively flow toward different directions in the second linear portions adjacent to each other, when the current flows from one of the edges of the conductive element to the other edge of the conductive element.

With this structure, magnetic field generation is avoided even when the current flows through the conductive element.

The conductive element may include a plurality of first linear portions positioned parallel to each other and each of which extends in a first direction, a plurality of second linear portions positioned parallel to each other and each of which extends in a second direction which is different from the first direction, a current input terminal, and a current output terminal electrically connected with the current input terminal. The plurality of first linear portions and the plurality of second linear portions may be placed such that the current respectively flow toward different directions in the first linear portions adjacent to each other, and the current respectively flow toward different directions in the second linear portions adjacent to each other, when the current flows from the current input terminal to the current output terminal.

With this structure, magnetic field generation is avoided even when the current flows through the conductive element.

The conductive element may include a narrow portion which is formed to have narrower width than those of the rest of portions of the conductive element.

With this structure, the conductive element is easily opened at the narrow portion when the current flows therethrough.

The conductive element may include a broad portion which is formed to have wider width than those of the rest of portions of the conductive element.

As the broad portion enables electro migration of the conductive element to become large, the conductive element is easily opened at the place between the broad portion and a current output terminal.

The conductive element may further include a current input terminal and a current output terminal, the broad portion may be formed between the current input terminal and the turned portion. The broad portion may be formed in the vicinity of the turned portion of the conductive element.

As the electro migrations of the conductive element at the corner is small, the conductive element is easily opened at the place between the broad portion and the turned portion.

The broad portion may be formed in the vicinity of the current input terminal. As described above, the conductive element turns plurality of times, and the broad portion placed in the vicinity of the conductive element is kept at relatively high temperature. Thus, with the electro migration of the broad portion and the conductive element, the conductive element is easily opened in the vicinity of the broad portion.

The broad portion may be formed substantially in the center of the conductive element.

As described above, the conductive element turns plurality of times, and the center portion of the conductive element is kept at relatively high temperature. Thus, the conductive element is easily opened at the center portion thereof when the current flows therethrough. In addition, by forming the broad portion in the center of the conductive element, the conductive element is more easily opened by the current.

According to the present invention, there is provided a semiconductor device comprising: a semiconductor substrate; and a conductive element formed on the semiconductor substrate and capable of being opened when a predetermined current flows, wherein the conductive element is formed to have a corner and includes a broad portion which is formed to have wider width than those of the rest of portions of the conductive element.

As the broad portion enables electro migration of the conductive element to become large, the conductive element is easily opened at the place between the broad portion and a current output terminal. In addition, the electro migrations of the conductive element at the corner is small. Therefore, the conductive element formed as above is easily opened at the place between the broad portion and the corner by the current.

The conductive element may further include a current input terminal and a current output terminal, the broad portion may be formed between the current input terminal and the corner. The broad portion may be formed in the vicinity of the corner of the conductive element.

The broad portion may be formed substantially in the center of the conductive element.

The semiconductor device may further include a second conductive formed to surround the conductive element, wherein the conductive element and the second conductive element may be insulated from each other.

With this structure, the heat generated at the conductive portion when the current flows therethrough is reflected by the second conductive element and remains inside the second conductive element. Thus, the conductive element is more easily opened.

The second conductive element may include a via conductive element which is formed at the side of the conductive element.

The second conductive element may include a conductive plate which is formed above or below the conductive element.

The conductive element may be constituted of a material mainly including copper, a poly-silicon including impurities, SiGe (silicon germanium), or silicide.

The semiconductor device may further include a transistor formed on the semiconductor substrate. The current supplied to the conductive element is controlled by switching on and off the transistor. The transistor may be MOSFET.

It is to be noted that any arbitrary combination of the above-described structural components and expressions whether directed to a method, an apparatus, or a system and so forth are all effective and are encompassed by the present embodiments.

Moreover, this summary of the invention does not necessarily describe all necessary features so that the invention may also be a sub-combination of these described features.

BRIEF DESCRIPTION OF THE DRAWINGS

FIG. 3 shows a plan view of a fuse in a second embodiment according to the present invention.

DETAILED DESCRIPTION OF THE INVENTION

The invention will now be described based on preferred embodiments which are not intended to limit the scope of the present invention but to exemplify the invention. All of the features and the combinations thereof described in the embodiments are not necessarily essential to the invention.

Figure 10:
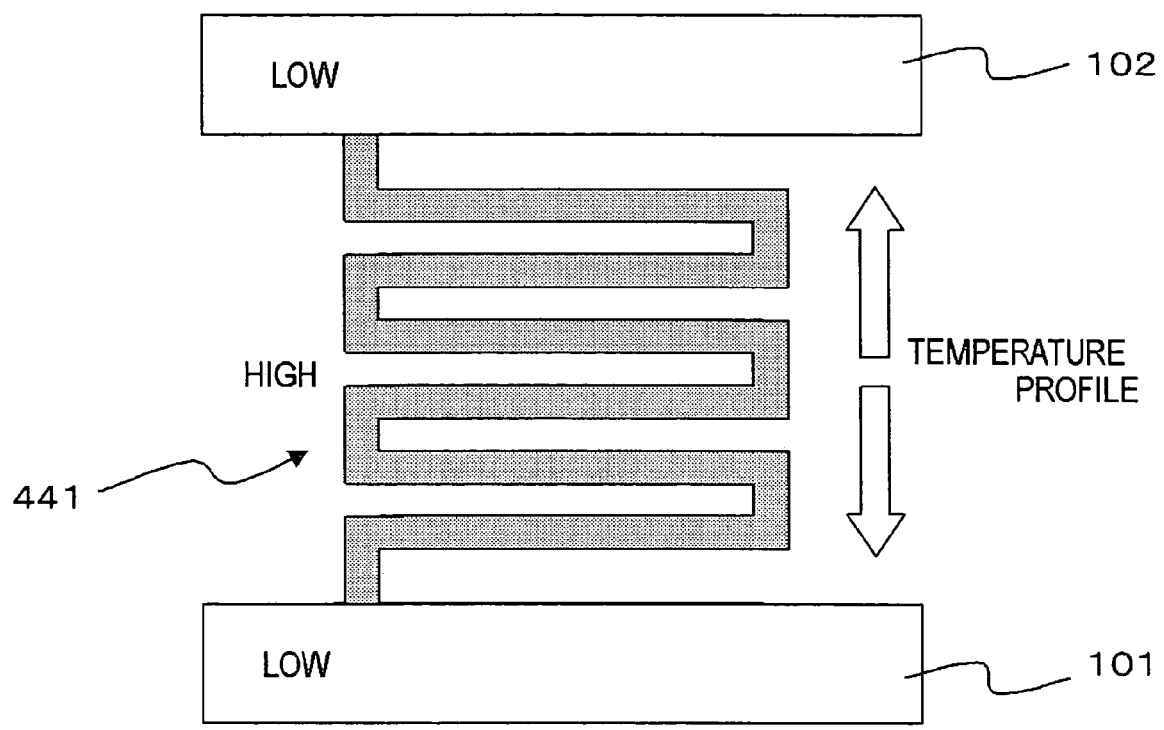
FIG. 10 shows an example of a fuse according to the present invention.

FIG. 10 shows an example of a fuse according to the present invention. The fuse 440 includes a conductive line 441, and a current input terminal 101 and a current output terminal 102 formed at the both ends of the conductive line 441. In this example, the conductive line 441 of the fuse 440 is constituted of a plurality of linear portions and angled connecting portions each of which connect adjacent linear portions to each other.

The fuse 440 turns a plurality of times. In this specification, the word "turn" or the word "turning" means that at which the conductive line rotates more than 90 degrees. In this example shown in FIG. 10, the conductive line 441 rotates 90 degree at a corner between one of the linear portions and one of the angled portion, and rotates again at a next corner between the angled portion and one of the linear portions. Thus, the turning includes two corners in this example.

Therefore, some of the linear portions placed at a center of the plurality of linear portions are kept at a relatively high temperature as they are heated by other linear portions surrounding them. Thus, the conductive line 441 of the fuse 440 has a temperature profile as shown in FIG. 10. Therefore, there is concern that the fuse 440 could be easily opened at the center of the conductive line 441.

The embodiments of the present invention will be explained in the following.

Figure 1:
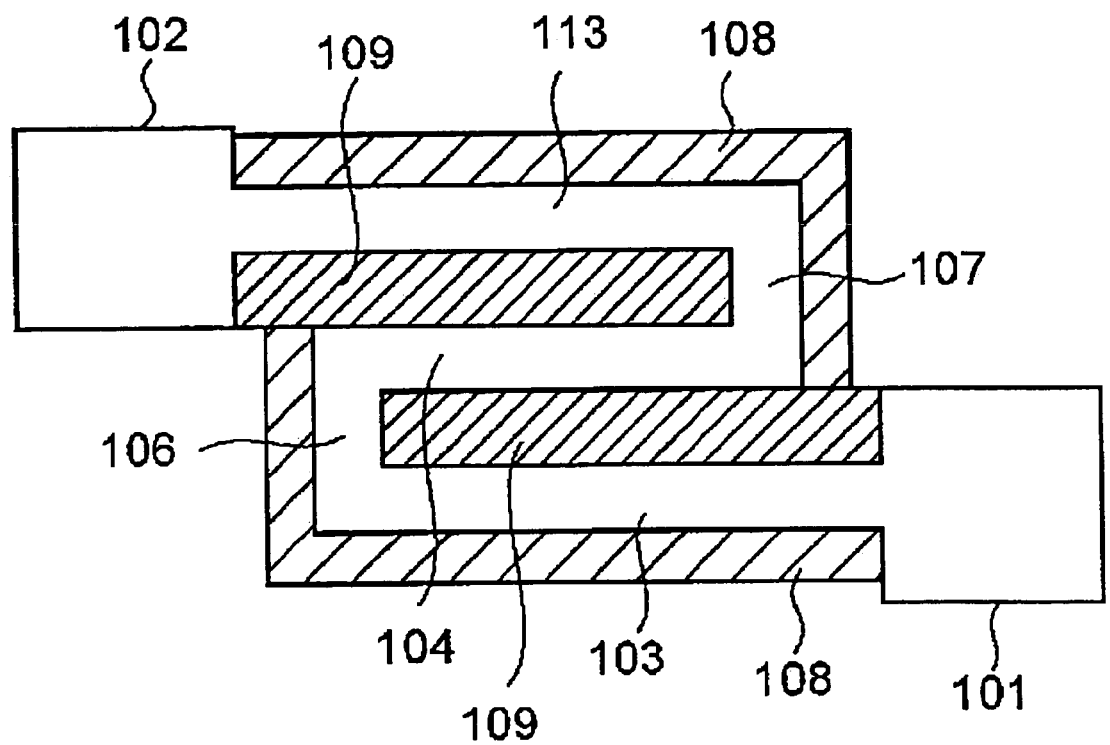
FIG. 1 shows a plan view of a fuse of a first embodiment according to the present invention.

FIG. 1 shows a plan view of a fuse of a first embodiment according to the present invention. In this embodiment, the fuse 100 turns twice.

The fuse 100 is formed on an insulating layer formed on a semiconductor substrate, for example. In this case, the insulating layer includes any layers formed at any level on the semiconductor substrate. The insulating layer may include an insulating layer which isolates elements, an insulating inter layer, or an interlayer insulating layer which is formed at the bottom of a trench.

The fuse 100 includes a current input terminal 101 and a current output terminal 102 at its ends. The fuse 100 further includes a first one way linear portion 103, a first other way linear portion 104, and a second one way linear portion 113 between the current input terminal 101 and the current output terminal 102. The fuse 100 further includes a first angled connecting portion 106 which connects the first one way linear portion 103 and the first other way linear portion 104, and a second angled connecting portion 107 which connects the first other way linear portion 104 and the second one way linear portion 113.

The fuse 100 has a first turning including a first corner between the first one way linear portion 103 and the first angled connecting portion 106, and a second corner between the first angled connecting portion 106 and the first other way linear portion 104, and a second turning including a third corner between the first other way linear portion 104 and the second angled connecting portion 107, and a fourth corner between the second angled connecting portion 107 and the second one way linear portion 113.

In fuse 100 formed as above, when a certain current flows from the current input terminal 101 to the current output terminal 102, heat is generated at shaded portions 108 which are formed outside of the fuse 100 and are added to heat generated at shaded portions 109 which are formed inside of the fuse 100. The shaded portions 108 and the shaded portions 109 may be an insulating layer and may be constituted of insulating materials, for example. Thus, the first other way linear portion 104 placed between the shaded portions 109 is heated by the shaded portions 109 and is easily opened. Therefore, the fuse 100 is easily cut. The fuse may be constituted of a material mainly including copper, a poly-silicon including impurities, SiGe (silicon germanium), or silicide.

Figure 11:
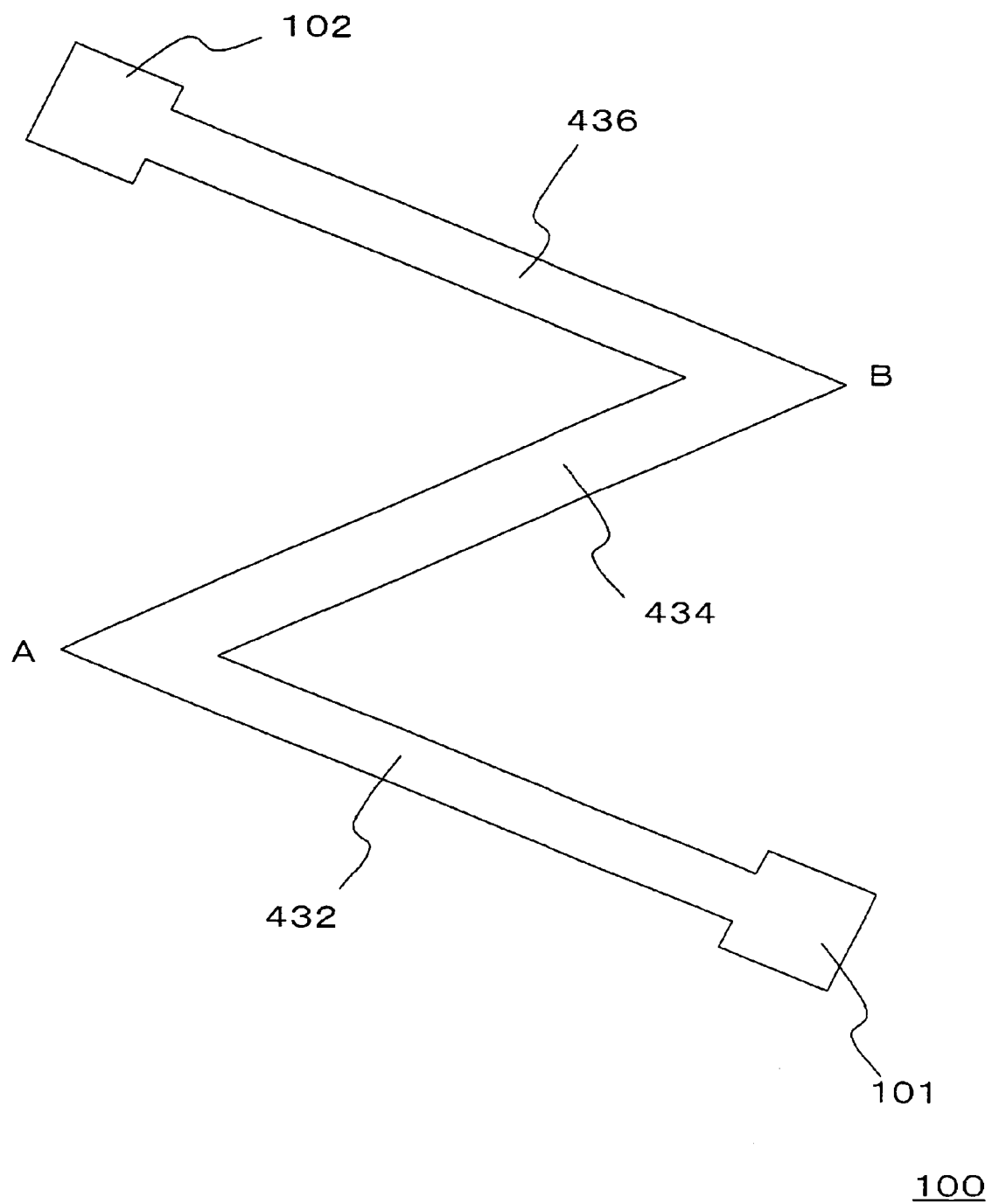
FIG. 11 shows an alternative example of fuse shown in FIG. 1.

FIG. 11 shows an alternative example of the fuse 100 shown in FIG. 1. The fuse 100 shown in FIG. 11 rotates substantially perpendicular at each of the corners. The fuse 100 may rotate more than 90 degrees at each of the corners, a point A or a point B, as shown in the drawing. The fuse 100, in this case, has a first one way linear portion 432, a first other way linear portion 434, and a second one way linear portion 436. The first one way linear portion 432 and the first other way linear portion 434 form an acute angle less than 90 degrees. The first other way linear portion 434 and the second one way linear portion 436 form an acute angle less than 90 degrees. With this structure shown in FIG. 11, the first other way linear portion 434 placed in the middle of the linear portions 432 and 436 is heated by those linear portions 432 and 436. Thus, the first other way linear portion 434 is easily opened by current.

Figure 12:
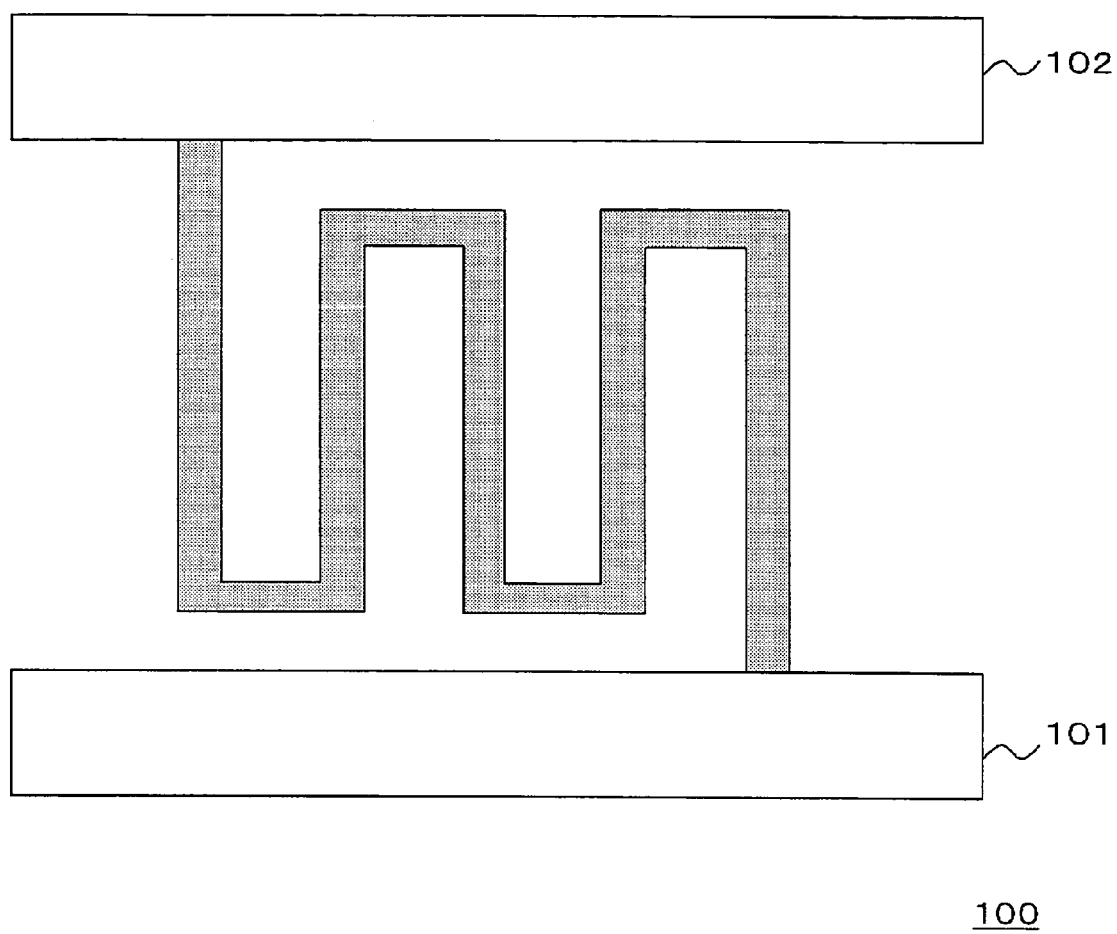
FIG. 12 shows another alternative example of fuse shown in FIG. 1.

FIG. 12 shows another alternative example of the fuse 100 shown in FIG. 1.

As the current input terminal 101 and the current output terminal 102 are formed to have large areas, there is a concern that a large amount of heat radiation will occur in the fuse near the connecting point of the terminals 101 and 102. Therefore, the effect of the introduction of a plurality of turnings on the ease with which the fuse is opened will be reduced. The fuse shown in FIG. 12 has a structure such that the turnings of the fuse are placed far from the terminals 101 and 102. Thus, heat does not radiate away from the turnings of the fuse in this example. Therefore, the fuse 100 is easily opened by current.

Figure 2A:
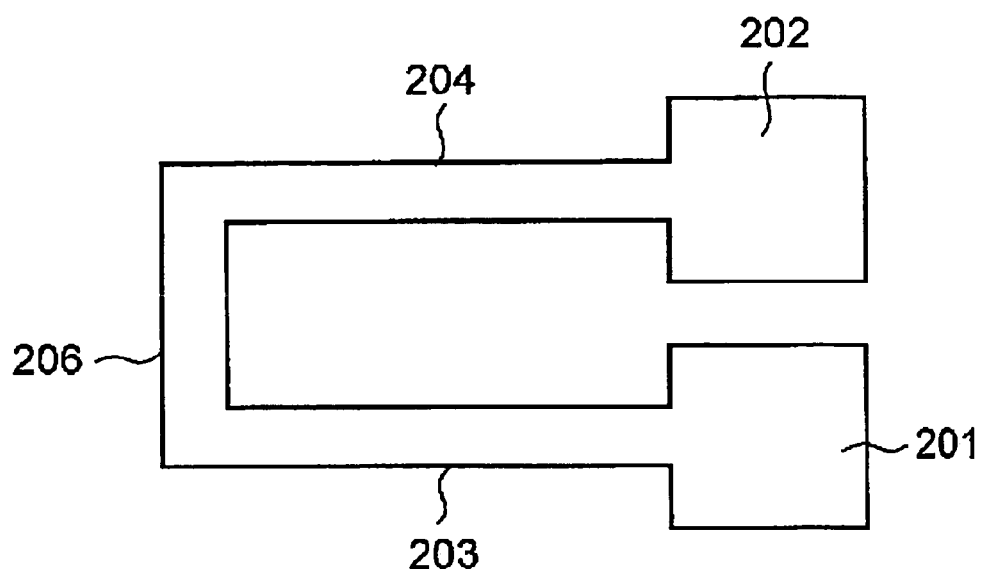
FIGS. 2A and 2B show a fuse which turns once.
Figure 2B:
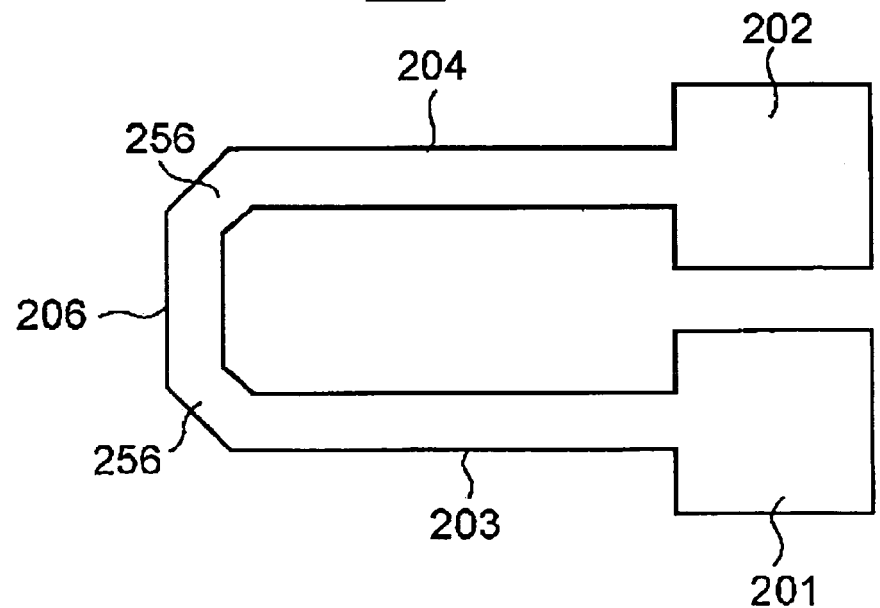

FIGS. 2A and 2B respectively show a fuse which turns once.

FIG. 2A shows a plan view of a fuse 200 which is a single unit of the fuse 100 shown in FIG. 1. The fuse 200 includes a current input terminal 201 and a current output terminal 202 at its ends. The fuse 200 further includes a one way linear portion 203, an other way linear portion 204, and an angled connecting portion 206 which connects the one way linear portion 203 and the other way linear portion 204.

FIG. 2B shows an alternative example of the fuse 200 shown in FIG. 2A. The fuse 210 may further include oblique connecting portions 256 placed between the one way linear portion 203 and the angled connecting portion 206, and between the angled connecting portion 206 and the other way linear portion 204. With this structure, the current is efficiently supplied to the place at which fuse 210 is to be opened.

The fuse of the embodiments according to the present invention may include the units shown in FIGS. 2A and 2B.

FIG. 3 shows a plan view of a fuse of a second embodiment according to the present invention. In this embodiment, the fuse 300 turns four times.

The fuse 300 is formed on an insulating layer formed on a semiconductor substrate, for example. The fuse 300 includes a current input terminal 301 and a current output terminal 302 at its ends. The fuse 300 further includes a first one way linear portion 303, a first other way linear portion 304, a second one way linear portion 313, a second other way linear portion 314, and a third one way linear portion 323 between the current input terminal 301 and the current output terminal 302. The fuse 300 further includes a first angled connecting portion 306 which connects the first one way linear portion 303 and the first other way linear portion 304, a second angled connecting portion 307 which connects the first other way linear portion 304 and the second one way linear portion 313, a third angled connecting portion 316 which connects the second one way linear portion 313 and the second other way linear portion 314, and a fourth angled connecting portion 317 which connects the second other way linear portion 314 and the third one way linear portion 323.

In the fuse 300 formed as above, when a certain current flows from the current input terminal 301 to the current output terminal 302, heats generated at shaded portions 308 which are formed outside of the fuse 300 are added to heat generated at shaded portions 309 which are formed inside of the fuse 300. Thus, the three linear portions placed at the center of the fuse 300, the first other way linear portion 304, the second one way linear portion 313, and the second other way linear portion 314, are easily opened. Logically, of these three linear portions, the second one way linear portion 313 which is placed at the center of the other linear portions is most easily opened. In this embodiment, fuse 300 is easily opened with the heat distributions generated at the periphery of the fuse 300.

Figure 13:
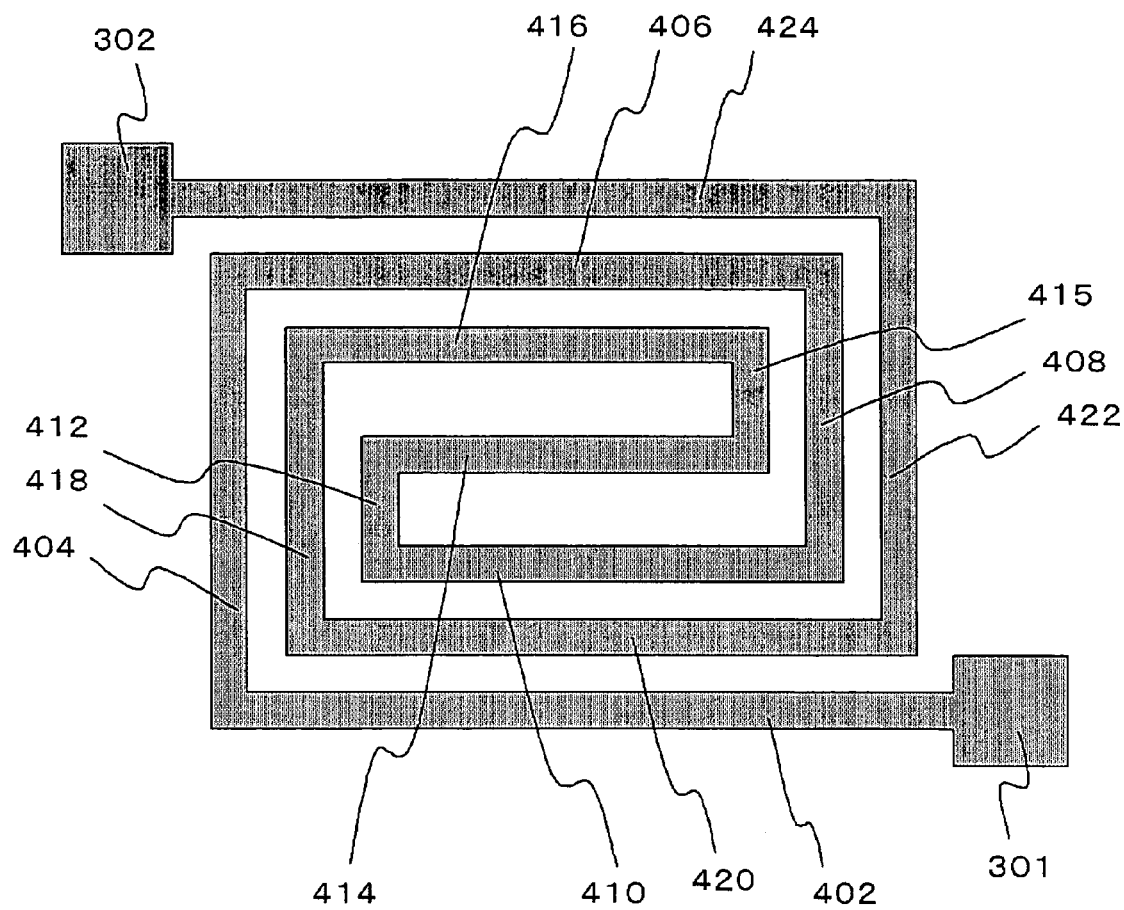
FIG. 13 shows an alternative example of fuse shown in FIG. 3.

FIG. 13 shows an alternative example of the fuse 300. The fuse 300 shown in FIG. 13 turns six times.

The fuse 300 includes a current input terminal 301 and a current output terminal 302 at its ends. The fuse 300 further includes a first one way linear portion 402, a first other way linear portion 406, a second one way linear portion 410, a second other way linear portion 414, a third one way linear portion 416, a third other way linear portion 420, and a fourth one way linear portion 424 between the current input terminal 301 and the current output terminal 302. The fuse 300 further includes a first angled connecting portion 404 which connects the first one way linear portion 402 and the first other way linear portion 406, a second angled connecting portion 408 which connects the first other way linear portion 406 and the second one way linear portion 410, a third angled connecting portion 412 which connects the second one way linear portion 410 and the second other way linear portion 414, a fourth angled connecting portion 415 which connects the second other way linear portion 414 and the third one way linear portion 416, a fifth angled connecting portion 418 which connects the third one way linear portion 416 and the third other way linear portion 420, and a sixth angled connecting portion 422 which connects the third other way linear portion 420 and the fourth one way linear portion 424.

With the above structure, the second other way linear portion 414 is easily opened. As the second other way linear portion 414 is surrounded at four sides by the linear portions and angled connecting portions, the second other way linear portion 414 is kept at relatively high temperature and the fuse is easily opened at its center.

In addition, the linear portions (or angled connecting portions) of the fuse 300 are preferably designed to be placed such that when the current flows from the current input terminal 301 to the current output terminal 302, the current flows in opposite directions in the linear portions adjacent to each other.

In FIG. 13, for example, when the current flows from the current input terminal 301 to the current output terminal 302, the current flows from right to left in the first one way linear portion 402. On the other hand, at the same time in FIG. 13, the current flows from left to right in the third other way linear portion 420 which is adjacent to the first one way linear portion 402.

Likewise, in FIG. 13, when the current flows from the current input terminal 301 to the current output terminal 302, the current flows from bottom to top in the first angled connecting portion 404. On the other hand, at the same time in FIG. 13, the current flows from top to bottom in the fifth angled connecting portion 418 which is adjacent to the first angled connecting portion 404.

With this structure, magnetic field generation is avoided even when the current flows through the fuse 300.

As described above, the fuse in the embodiments according to the present invention includes at least a linear portion which is surrounded by other linear portions. With this structure, the linear portion surrounded by other linear portions is kept at a relatively high temperature such that the linear portion is easily opened by the current.

Figure 4:
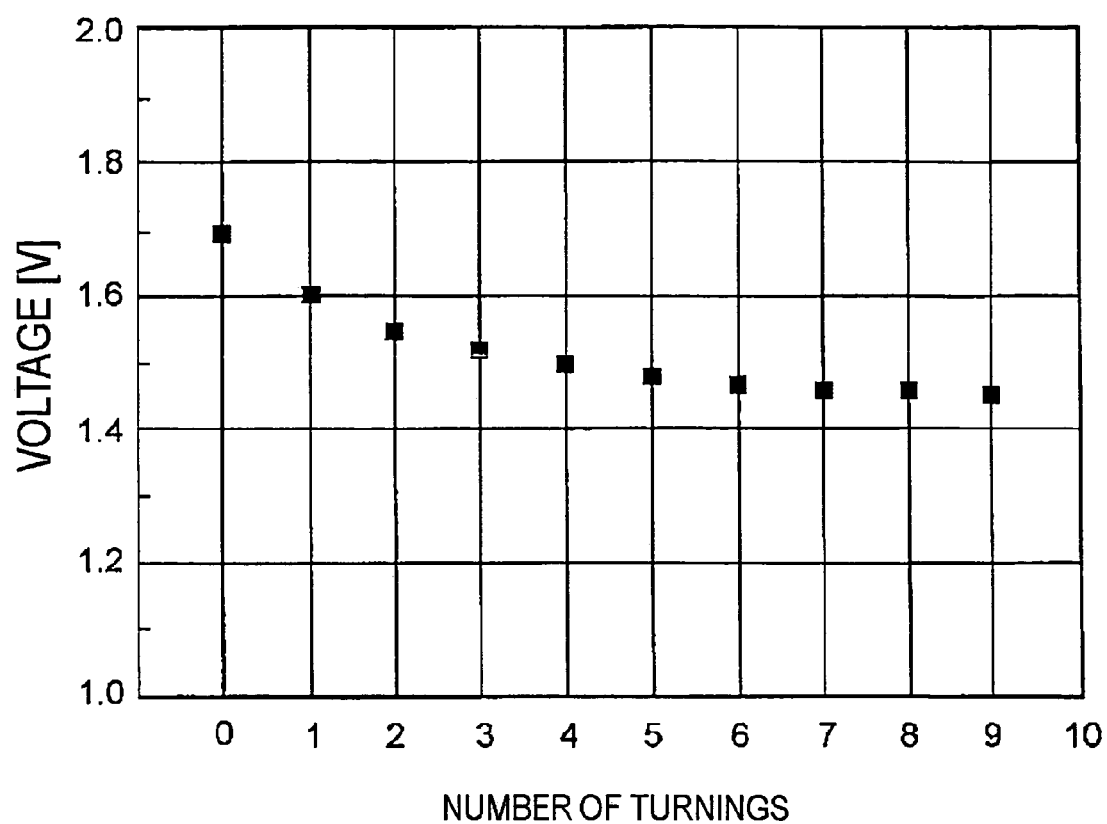
FIG. 4 shows the relationship between the number of the turnings in each of the fuses and the voltage necessary to open each of the fuses.
Figure 5:
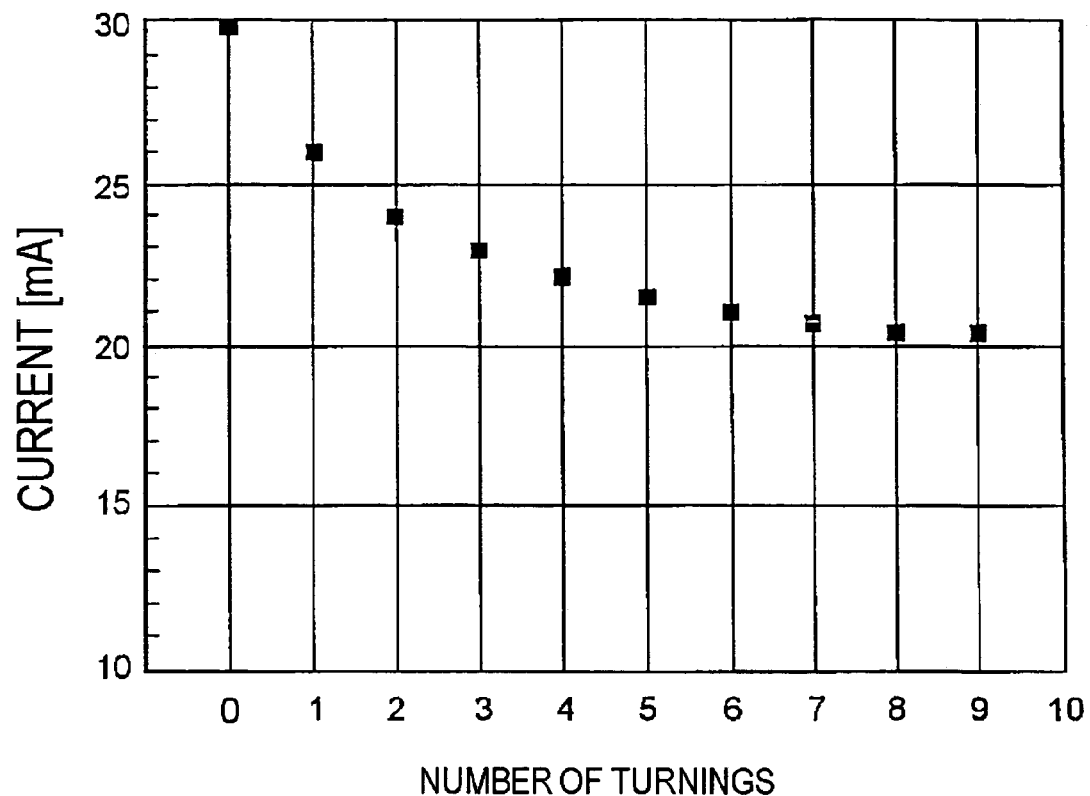
FIG. 5 shows the relationship between the number of turnings in each of the fuses and current necessary to open each of the fuses.

FIGS. 4 and 5 show the relationships between the number of the turnings in each of the fuses and voltage or current necessary to open each of the fuses. Here, each of the conductive lines formed between the current input terminal and the current output terminal of each of the fuses has same length. The number "0 (zero)" in the horizontal axis means that the current input terminal and the current output terminal of a fuse are placed on a line and connected via a linear conductive line. The values on the vertical axis shown in FIG. 4 indicate the voltage supplied between the current input terminal and the current output terminal that is necessary to open each of the fuses. The values on the vertical axis shown in FIG. 5 indicate the current supplied between the current input terminal and the current output terminal that is necessary to open each of the fuses.

As shown in FIGS. 4 and 5, as the number of the turnings in a fuse increase, the voltage or the current necessary to open the fuse decreases. When the number of the turnings increases further, the decrease in the voltage value or the current value approaches a limit.

As described above, according to the first embodiment and the second embodiment of the present invention, it is possible to reduce the voltage or current that must be supplied to the fuse in order to open the fuse.

Figure 6:
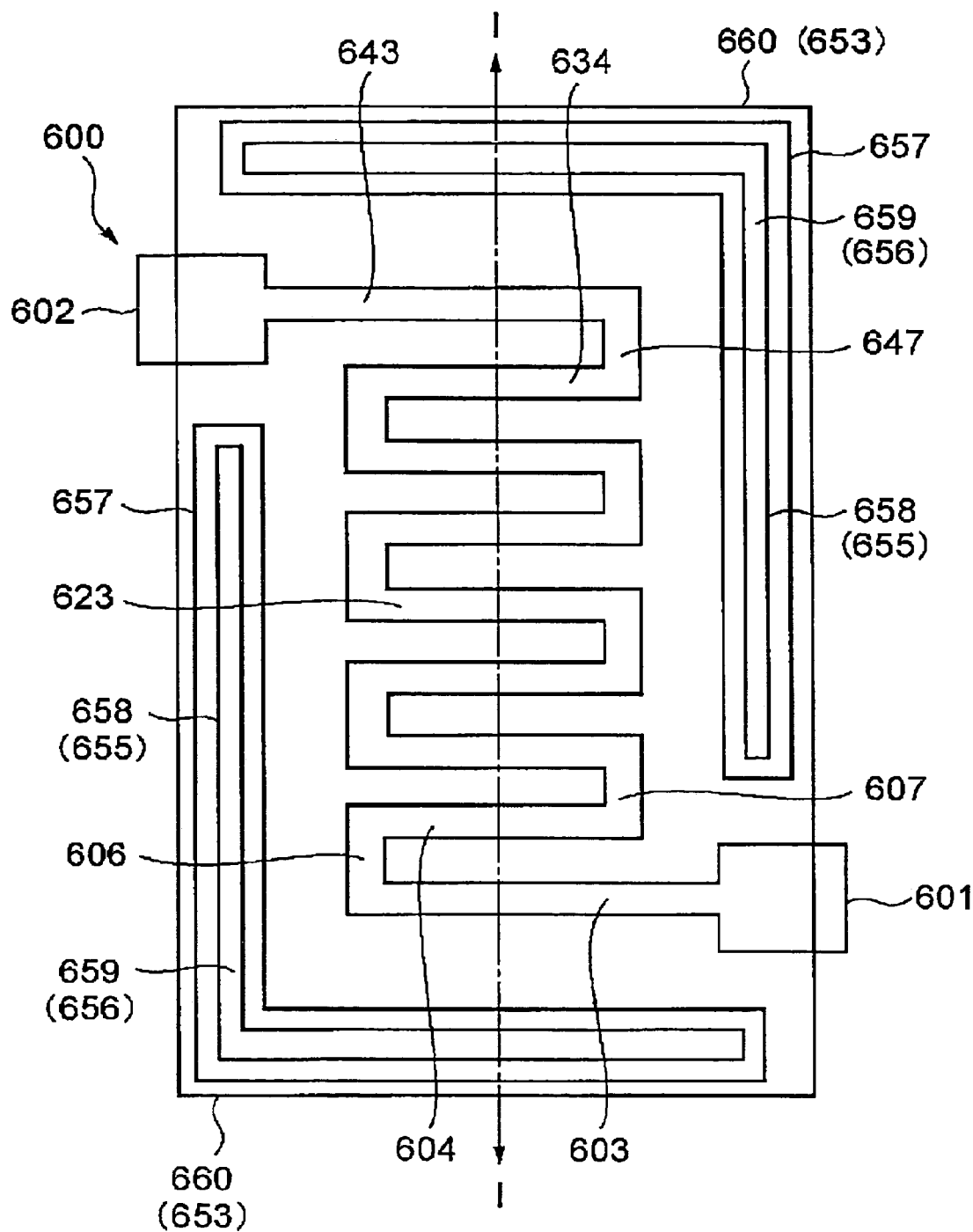
FIG. 6 is a plan view showing the fuse in a third embodiment according to the present invention.
Figure 7:
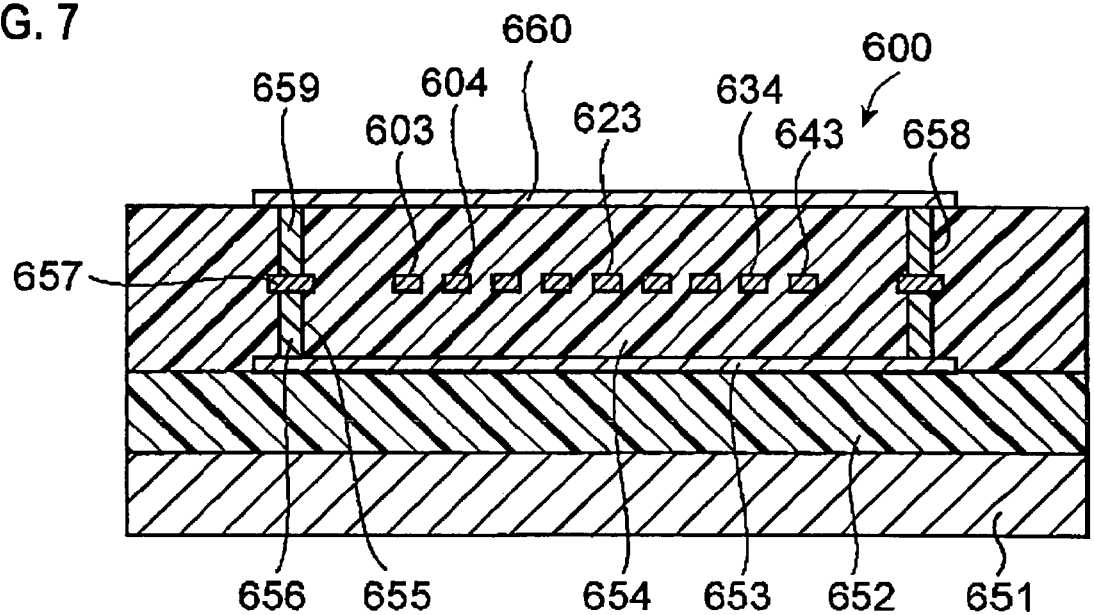
FIG. 7 is a cross sectional view along the I—I line shown in FIG. 6.

FIGS. 6 and 7 show a fuse of a third embodiment according to the present invention. FIG. 6 is a plan view showing the fuse of this embodiment. FIG. 7 is a cross sectional view on the I—I line shown in FIG. 6. In this embodiment, the fuse is covered with a conductive portion other than that of the conductive lines of the fuse itself.

Now, referring to FIGS. 6 and 7, the structure of the fuse 600 will be explained.

The fuse 600 is formed in a second insulating layer 654 which is formed on a first insulating layer 652 formed on a semiconductor substrate 651. Here, to simplify the explanation, the second insulating layer 654 is shown as a single layer. Actually, the second insulating layer 654 is constituted of a plurality of insulating layers. The fuse 600 is covered with a bottom plate 653, a top plate 660, and vias 656 and 659 at its bottom, top, and sides respectively. The vias 656 and 659 are formed to fill the via holes 655 and 658, respectively. The vias 656 and 659 are connected with each other through a pad terminal 657 which is formed simultaneously with the fuse 600. The vias 656 and 659 may be not necessarily connected though the pad terminal 657 as long as the vias 656 and 659 are formed to function as a wall to prevent the conductive materials diffusing from the fuse 600 and affecting other devices when the fuse 600 is opened.

The fuse 600 is opened when a certain current flows from the current input terminal 601 to the current output terminal 602. The fuse 600 includes a first one way linear portion 603 which is connected to the current input terminal 601, a first other way linear portion 604, and a first angled connecting portion 606 which connects the first one way linear portion 603 and the first other way linear portion 604. The fuse 600 further includes a fifth one way linear portion 643 which is connected to the current output terminal 602, a fourth other way linear portion 634, and a eighth angled connecting portion 647 which connects the fifth one way linear portion 643 and the fourth other way linear portion 634. Logically, the third one way linear portion 623 at the center of the nine linear portions of the fuse 600 is most easily opened.

With the heat distributions generated at the periphery of the fuse 600, the fuse 600 is easily opened. In addition, in this embodiment, the conductive materials which diffuses from the fuse 600 when the fuse 600 is opened are blocked by the bottom plate 653, the top plate 660, and the vias 656 and 659 in such a way that they do not have an effect on other devices. Furthermore, by covering the fuse 600 with conductive materials other than the materials constituting the fuse 600, such as the bottom plate 653, the top plate 660, and the vias 656 and 659, the heat generated at the fuse 600 when the current flows therethrough is reflected by these conductive materials and remains inside those conductive materials. Thus, the fuse 600 is more easily opened.

Although it is disclosed in this embodiment that four sides of the fuse 600 are covered with the conductive materials, the present invention is not limited to this example. For example, only the upper and lower of the fuse 600 may be covered with the conductive materials, or only the left side and right side of the fuse 600 may be covered with the conductive materials.

Figure 8:
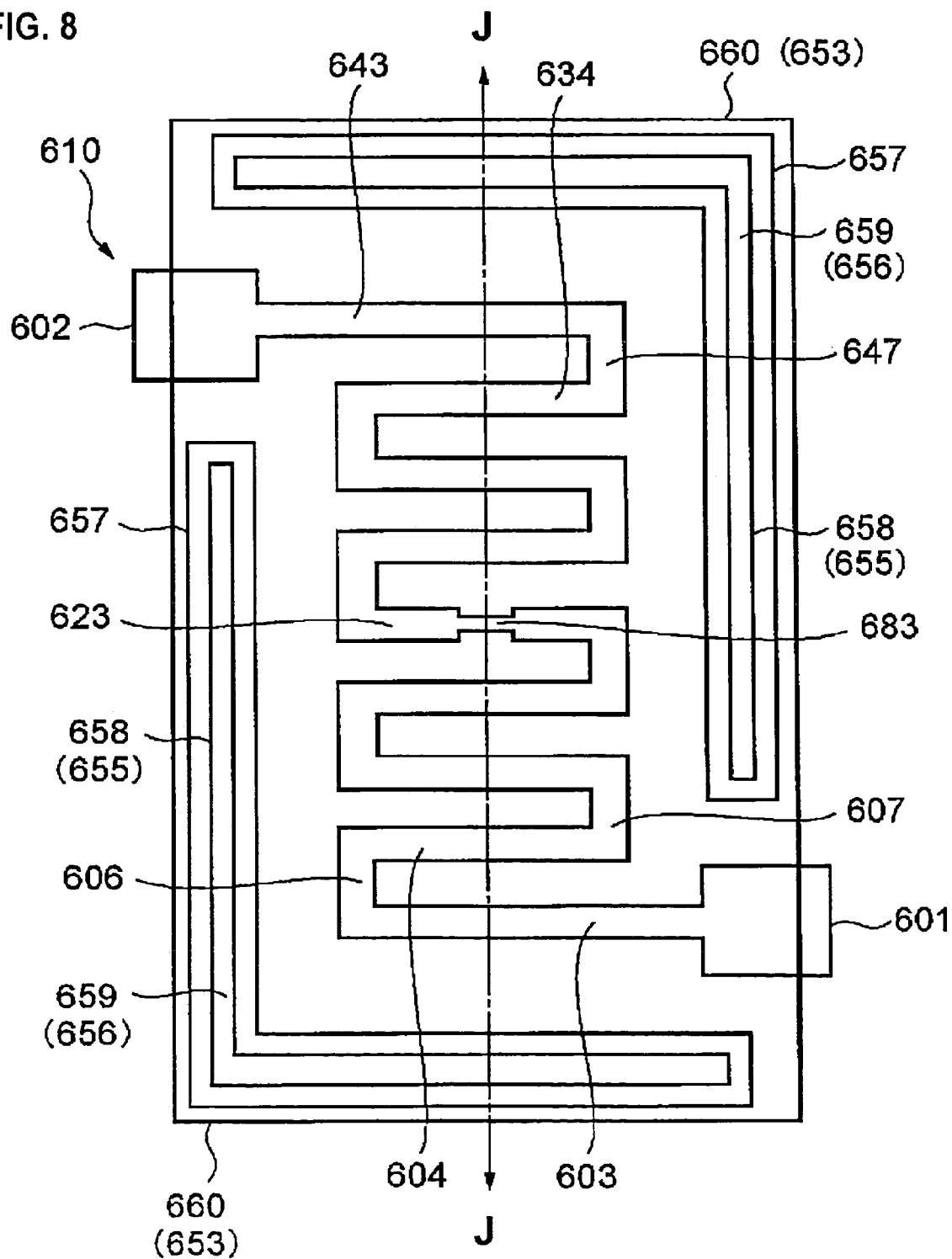
FIG. 8 is a plan view showing the fuse in the fourth embodiment according to the present invention.
Figure 9:
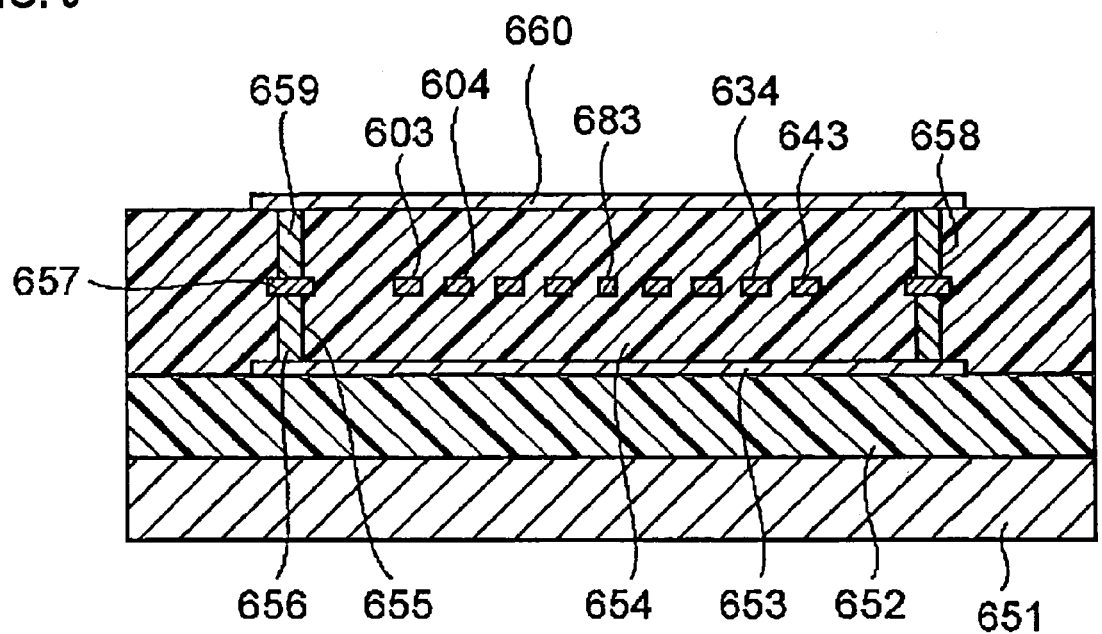
FIG. 9 is a cross sectional view along the J—J line shown in FIG. 8.

FIGS. 8 and 9 show a fuse of a fourth embodiment according to the present invention. FIG. 8 is a plan view showing the fuse of this embodiment. FIG. 9 is a cross sectional view on the J—J line shown in FIG. 8. As in the fuse of the third embodiment, the fuse in this embodiment is covered at top, lower, and sides with a conductive portion other than the conductive lines of the fuse itself. In addition, the fuse of this embodiment includes a narrow portion.

As shown in FIG. 8, the third one way linear portion 623, which is placed at a center of the nine linear portions that constitute the fuse 610, includes a narrow linear portion 683.

Due to this narrow linear portion 683, the fuse 610 can be opened with lower current or voltage than is necessary for the fuse 600 of the third embodiment.

Figure 14:
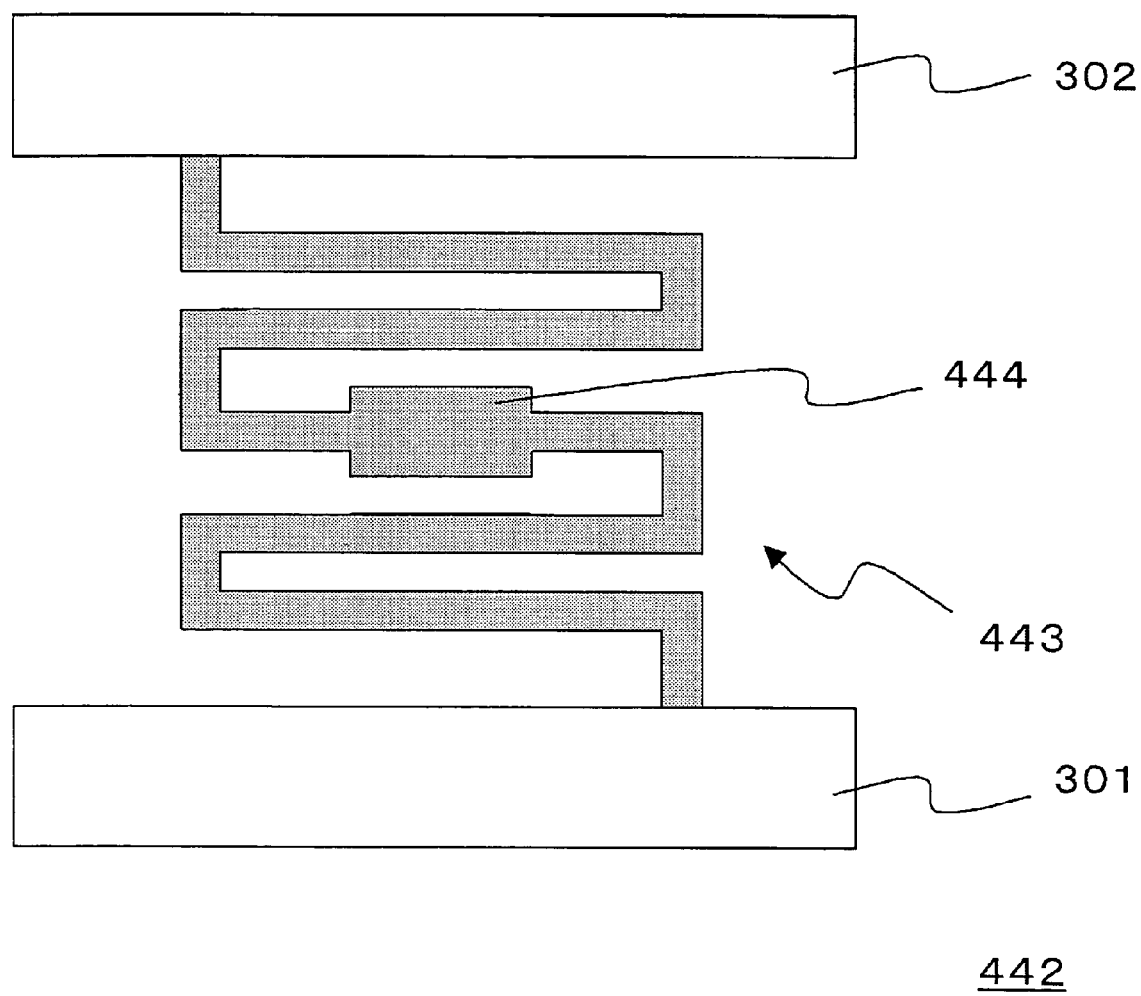
FIG. 14 shows a plan view of a fuse in a embodiment according to the present invention.

FIG. 14 shows a plan view of a fuse of a fifth embodiment according to the present invention. In this embodiment, the fuse 442 basically has a same structure as that of the fuse 300 shown in FIG. 3 of the second embodiment, and turns four times. The fuse 442 includes a conductive line 443 including a plurality of linear lines and a plurality of angled connecting portions, a current input terminal 301 and a current output terminal 302 formed at the ends of the conductive line 443. The fuse 442 further includes a broad portion 444 formed on the linear portion which is placed at the center of the plurality of linear portions. The broad portion 444 is formed to have a wider width than those of the linear portions. This broad portion 444 enables electro migration of the conductive materials constituting the fuse 442 to become large. Thus, the fuse 442 is easily opened at a point between the broad portion 444 and one of the turnings near the broad portion 444.

Figure 15A:
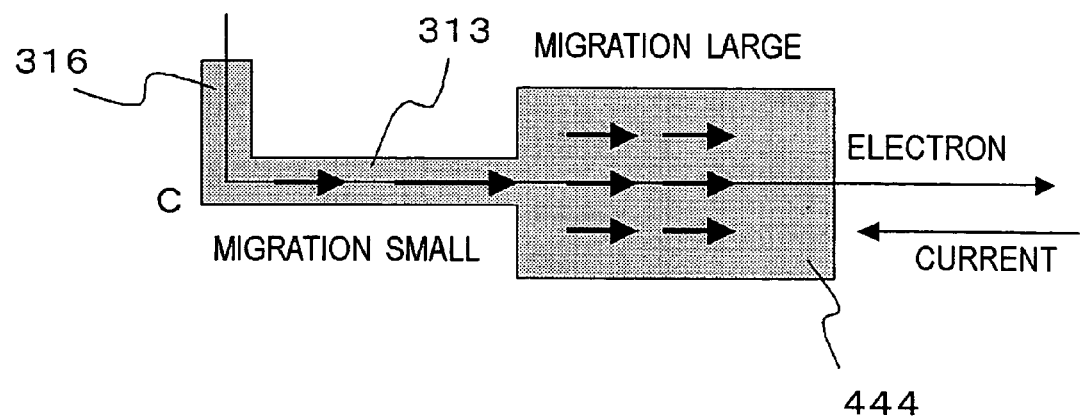
FIGS. 15A and 15B are diagrams showing how fuse is opened in the embodiment according to the present invention.
Figure 15B:
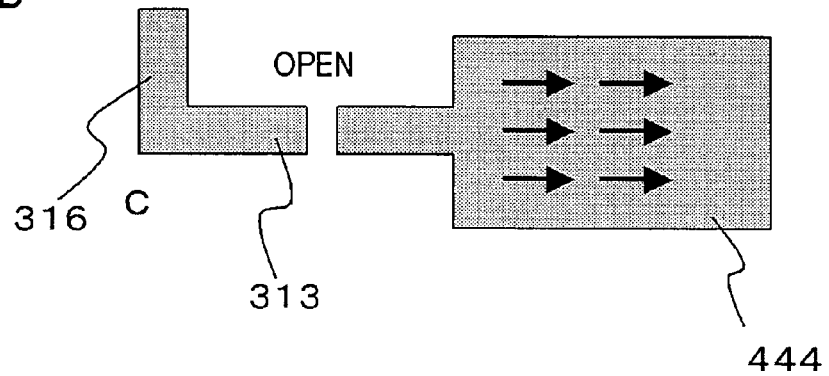

FIGS. 15A and 15B are diagrams showing how the fuse 442 is opened in this embodiment. As shown in FIG. 15A, the second one way linear portion 313 and the third angled connecting portion 316 are at right angles. Thus, the electro migrations of the conductive materials constituting the fuse 442 at the connecting point C of portions 313 and 316 are small. On the other hand, the electro migrations of the conductive materials constituting the fuse 442 in the broad portion 444 are large because the width of broad portion 444 is wider than the rest of the fuse 442. Due to these electro migrations of the conductive materials, the second one way linear portion 313 is easily opened as shown in FIG. 15B.

Figure 16:
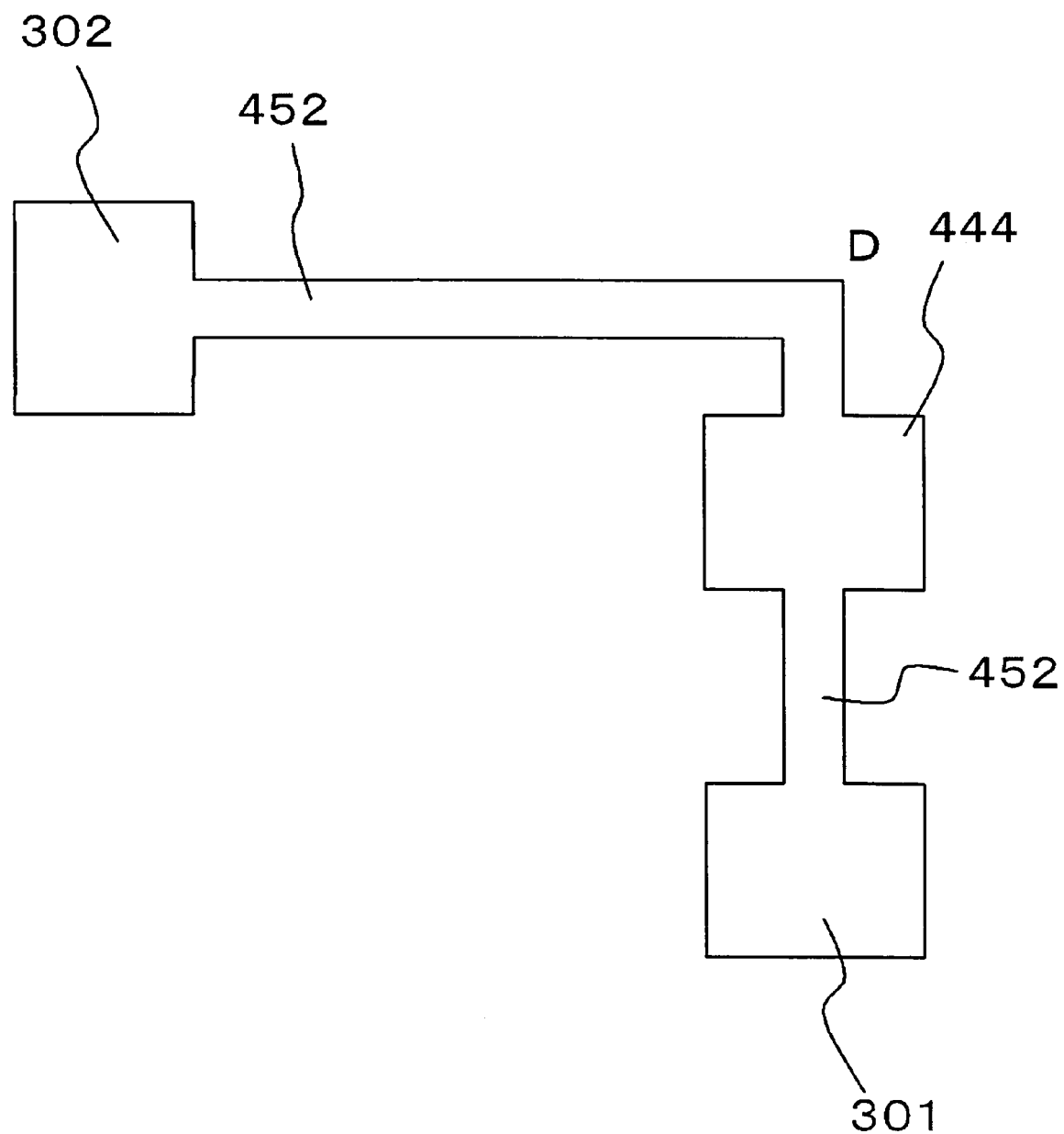
FIG. 16 shows an alternative example of the fuse the embodiment according to the present invention.
Figure 17A:
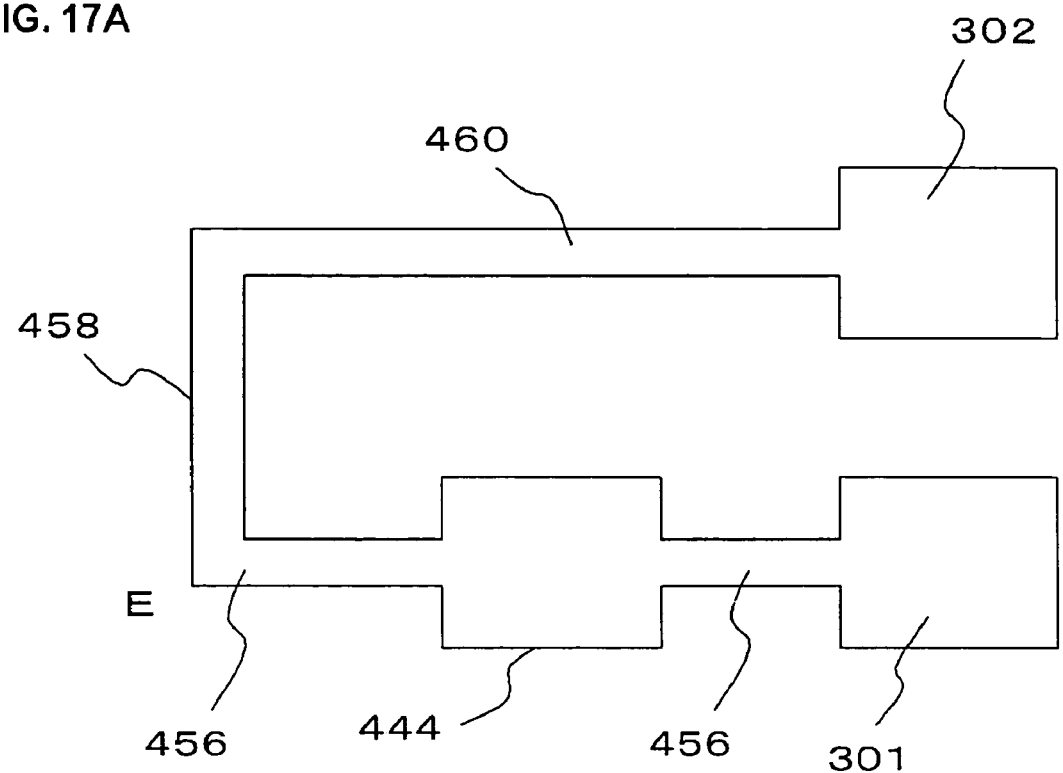
FIGS. 17A and 17B show an alternative example of the fuse in the embodiment according to the present invention.
Figure 17B:
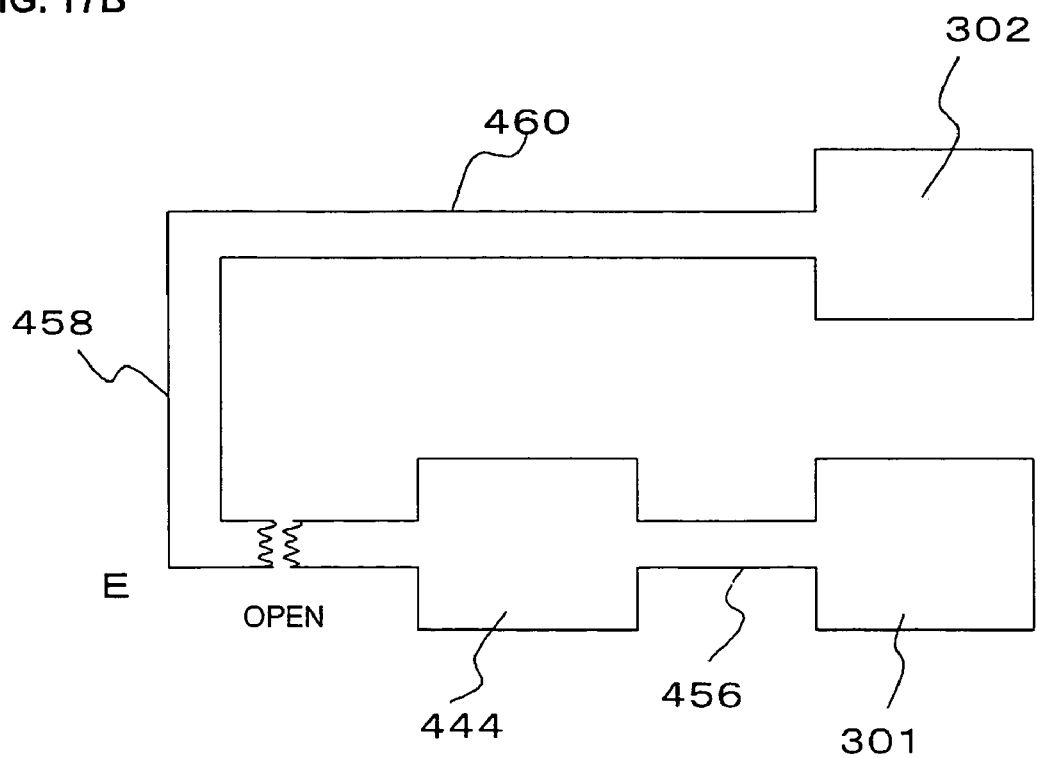

FIGS. 16, 17A and 17B show alternative examples of the fuse of the present embodiment.

As shown in FIG. 16, the fuse includes the broad portion 444 between the current input terminal 301 and the corner D joining linear portion 452 at a right angle. Due to the broad portion 444, the linear portion 452 is easily opened at a place between the corner D and the broad portion 444.

As shown in FIG. 17A, the fuse may include a first one way linear portion 456, a first angled connecting portion 458, and a first other way linear portion 460 between the current input terminal 301 and the current output terminal 302, in addition to terminals 301 and 302. The fuse may further include the broad portion 444 between the current input terminal 301 and the corner E at which first one way linear portion 456 is connected to the first angled connecting portion 458. With the broad portion 444, the first one way linear portion 456 is easily opened at a place between the broad portion 444 and the corner E as shown in FIG. 17B.

Figure 18:
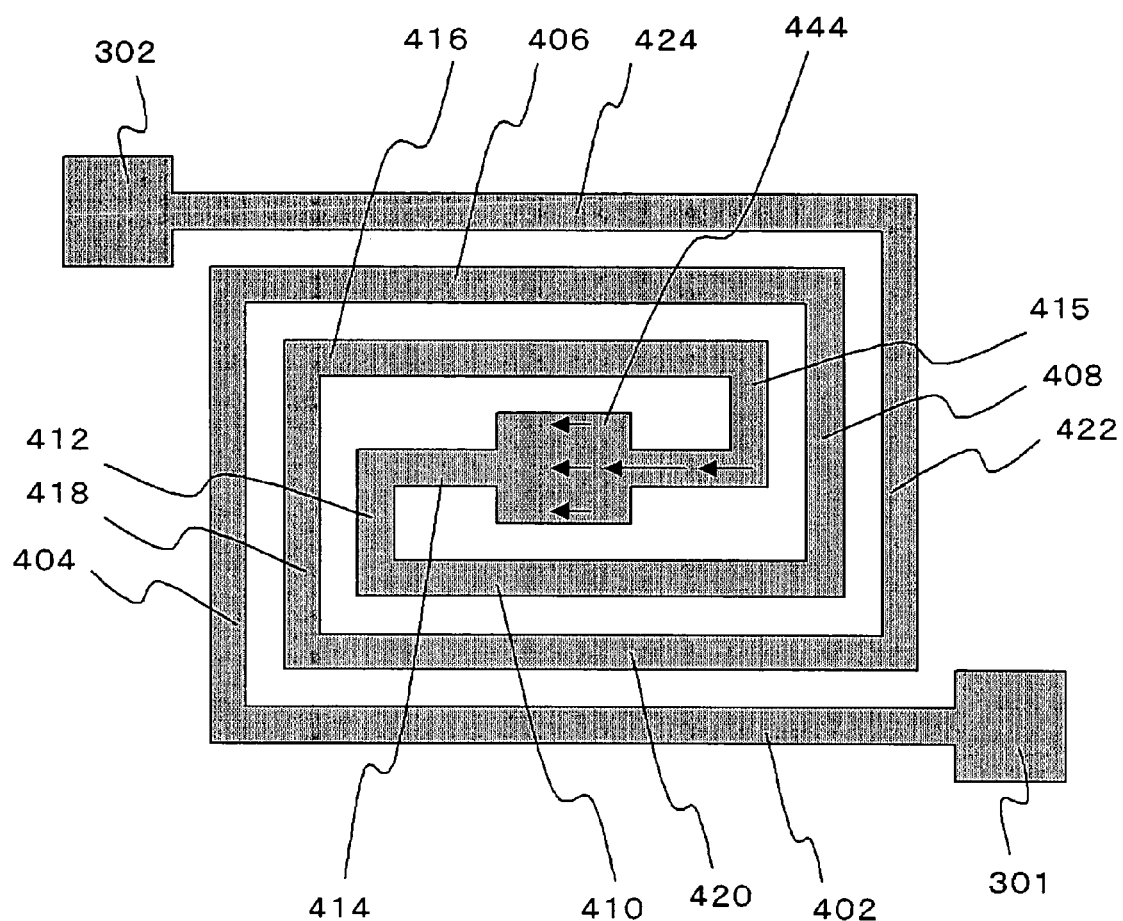
FIG. 18 shows another alternative example of the fuse in the embodiment according to the present invention.

FIG. 18 shows another alternative example of the fuse of the present embodiment. Here, the fuse 470 turns six times.

The fuse 470 includes a current input terminal 301 and a current output terminal 302 at its ends. The fuse 470 further includes a first one way linear portion 402, a first other way linear portion 406, a second one way linear portion 410, a second other way linear portion 414, a third one way linear portion 416, a third other way linear portion 420, and a fourth one way linear portion 424 between the current input terminal 301 and the current output terminal 302. The fuse 470 further includes a first angled connecting portion 404 which connects the first one way linear portion 402 and the first other way linear portion 406, a second angled connecting portion 408 which connects the first other way linear portion 406 and the second one way linear portion 410, a third angled connecting portion 412 which connects the second one way linear portion 410 and the second other way linear portion 414, a fourth angled connecting portion 415 which connects the second other way linear portion 414 and the third one way linear portion 416, a fifth angled connecting portion 418 which connects the third one way linear portion 416 and the third other way linear portion 420, and a sixth angled connecting portion 422 which connects the third other way linear portion 420 and the fourth one way linear portion 424.

The fuse 470 further includes the broad portion 444 formed on the second other way linear portion 414 which is placed at the center of the plurality of linear portions of the fuse 470.

With this structure, the second other way linear portion 414 is easily opened at a place between the broad portion 444 and the corner between the second other way linear portion 414 and the fourth angled connecting portion 415. As described above, due to the broad portion to the fuse, the electro migration of the conductive material at the broad portion is large and the fuse is easily opened. On the other hand, a concern remains that the amount of heat generated in the fuse will be radiated by the broad portion and the fuse will not be easily opened. However, with the structures shown in FIGS. 14 and 18, the broad portion is formed at the center of the fuse, and thus, the broad portion is kept at a relatively high temperature by heat from the remaining portions of the fuse that surround the broad portion. Therefore, the fuse is easily opened by taking advantage of the electro migration of the conductive material without being affected by radiant heat loss. In particular, in the fuse shown in FIG. 18, the broad portion 444 is kept at higher temperature because it is surrounded at four sides by the linear portions and angled connecting portions. Thus, the fuse 470 is more easily opened.

Figure 19:
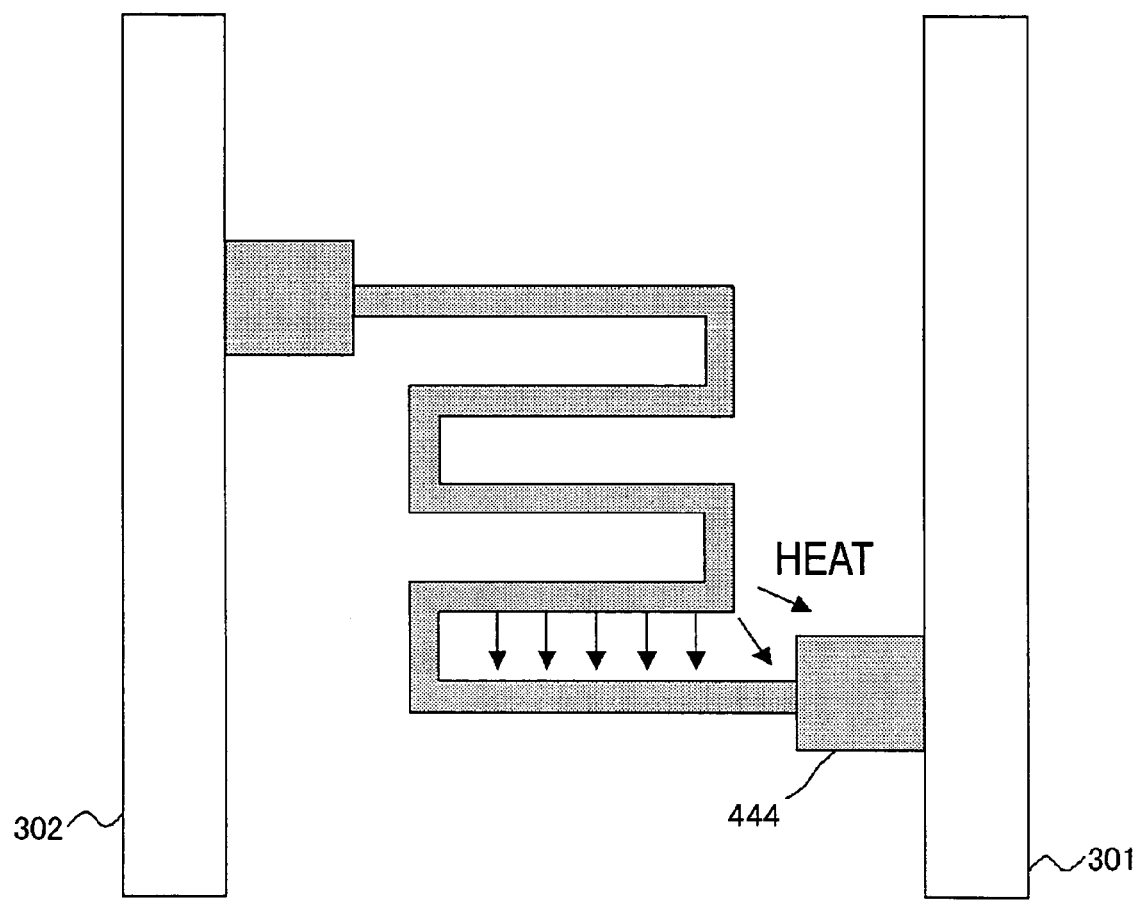
FIG. 19 shows another alternative example of the fuse in the embodiment according to the present invention.

The fuse of the present invention may include a structure such shown in FIG. 19. As described above, due to the broad portion to the fuse, the electro migration of the conductive material at the broad portion is large and the fuse is easily opened. On the other hand, a concern remains that the amount of heat generated in the fuse will be radiated by the broad portion and the fuse will not be easily opened. However, with the structure shown in FIG. 19, the conductive element turns plurality of times, and the broad portion 444 placed in the vicinity of the conductive element is kept at relatively high temperature. Thus, with the electro migration of the broad portion 444 and the conductive element, the conductive element is easily opened in the vicinity of the broad portion 444.

Although the above embodiments describe the conductive materials constituting the fuse as being formed on a plane which is parallel to the semiconductor substrate, the present invention is not limited to these embodiments. For example, the one way linear portions and the other way linear portions may be formed as vias which are perpendicular to the semiconductor substrate and formed to break through the insulating layer. In this case, the angled connecting portions which connect one of the one way linear portions and the next other way linear portions may be formed on a plane which is parallel to the semiconductor substrate. In this example, the current input terminal and the current output terminal of the fuse may be simultaneously formed with the angled connecting portions. Here, both of the current input terminal and the current output terminal may be formed above or below the insulating layer, or either the current input terminal or the current output terminal may be formed above the insulating layer and the other terminal may be formed below of the insulating layer.

Although the present invention has been described by way of exemplary embodiments, it should be understood that many changes and substitutions may further be made by those skilled in the art without departing from the scope of the present invention which is defined by the appended claims.

What is claimed is:

1. A semiconductor device comprising:
a semiconductor substrate; and
a conductive element formed on said semiconductor substrate and only being opened when a predetermined current flows through said conductive element;
wherein said conductive element includes a broad portion which is formed to have a wider width than those of remaining portions of said conductive element, said remaining portions include an L-shaped portion,
wherein said broad portion and said remaining portions are formed on the same layer,
wherein said semiconductor device further includes a second conductive element formed above said conductive element and a third conductive element formed below said conductive element, and
wherein said second conductive element and said third conductive element are insulated from said conductive element.

2. The semiconductor device as set forth in claim 1, wherein said conductive element further includes a current input terminal and a current output terminal, said broad portion being formed between said current input terminal and said L-shaped portion.

3. The semiconductor device as set forth in claim 1, wherein said broad portion is formed substantially in the center of said conductive element.

4. The semiconductor device as set forth in claim 1, wherein said conductive element is constituted of a material mainly including copper, a poly-silicon including impurities, SiGe (silicon germanium), or silicide.

5. The device as claimed in claim 1, wherein at least two of said remaining portions are each substantially U-shaped and said broad portion is between said at least two remaining portions.

6. The semiconductor device as set forth in claim 1, further comprising a via conductive element which is formed at a side of said conductive element, said via conductive element is insulated from said conductive element.

7. A semiconductor device comprising:
a semiconductor substrate; and
a conductive element formed on said semiconductor substrate;
wherein said conductive element includes a broad portion and remaining portions, said remaining portions include an L-shaped portion, said broad portion is formed to have a wider width than those of the remaining portions of said conductive element, said conductive element being opened only at said remaining portions when a predetermined current flows,
wherein said broad portion and said remaining portions are formed on the same layer,
wherein said semiconductor device further includes a second conductive element formed above said conductive element and a third conductive element formed below said conductive element, and
wherein said second conductive element and said third conductive element are insulated from said conductive element.

8. The semiconductor device as set forth in claim 7, wherein said conductive element further includes a current input terminal and a current output terminal, said broad portion being formed between said current input terminal and said L-shaped portion.

9. The semiconductor device as set forth in claim 7, wherein said broad portion is formed substantially in the center of said conductive element.

10. The semiconductor device as set forth in claim 7, wherein said conductive element is constituted of a material mainly including copper, a poly-silicon including impurities, SiGe (silicon germanium), or silicide.

11. The device as claimed in claim 7, wherein at least two of said remaining portions are each substantially U-shaped and said broad portion is between said at least two remaining portions.

12. The semiconductor device as set forth in claim 7, further comprising a via conductive element which is formed at a side of said conductive element, said via conductive element is insulated from said conductive element.

13. A semiconductor device comprising:
a semiconductor substrate; and a conductive element formed on said semiconductor substrate and only being opened when a predetermined current flows through said conductive element;

wherein said conductive element includes a broad portion and remaining portions, said remaining portions include an L-shaped portion, said broad portion is formed to have a wider width than those of the remaining portions of said conductive element, a width of an entirety of said broad portion in a direction vertical to a direction of current flow through the broad portion being substantially constant, wherein said broad portion and said remaining portions are formed on the same layer, wherein said semiconductor device further includes a second conductive element formed above said conductive element and a third conductive element formed below said conductive element, and wherein said second conductive element and said third conductive element are insulated from said conductive element.

14. The semiconductor device as set forth in claim 13, wherein said conductive element further includes a current input terminal and a current output terminal, said broad portion being formed between said current input terminal and said L-shaped portion.

15. The semiconductor device as set forth in claim 13, wherein said broad portion is formed substantially in the center of said conductive element.

16. The semiconductor device as set forth in claim 15, wherein said broad portion is rectangular.

17. The semiconductor device as set forth in claim 13, wherein said conductive element is constituted of a material mainly including copper, a poly-silicon including impurities, SiGe (silicon germanium), or silicide.

18. The semiconductor device as set forth in claim 13, further comprising a via conductive element which is formed at a side of said conductive element, said via conductive element is insulated from said conductive element.

19. A semiconductor device comprising:
a semiconductor substrate; and
a conductive element formed on said semiconductor substrate and only being opened when a predetermined current flows through said conductive element;

wherein said conductive element includes a broad portion which is formed to have a wider width than those of remaining portions of said conductive element, said remaining portions include an L-shaped portion, wherein said broad portion and said remaining portions are formed on the same layer, wherein said semiconductor device further includes a second conductive element formed above said conductive element and a third conductive element formed below said conductive element, wherein said second conductive element and said third conductive element are insulated from said conductive element, wherein heat is generated in the vicinity of said broad portion, and said heat functions to heat said broad portion, and wherein said heat is generated by at least a portion of said remaining portions, and said heat heats said broad portion due to said predetermined current that flows through said conductive element.

20. The semiconductor device as set forth in claim 19, wherein said conductive element further includes a current input terminal and a current output terminal, said broad portion being formed between said current input terminal and said L-portion.

21. The semiconductor device as set forth in claim 19, wherein said broad portion is formed substantially in the center of said conductive element.

22. The semiconductor device as set forth in claim 19, wherein said conductive element is constituted of a material mainly including copper, a poly-silicon including impurities, SiGe (silicon germanium), or silicide.

23. The device as claimed in claim 19, wherein at least two of said remaining portions are substantially U-shaped and said broad portion is between said at least two remaining portions.

24. The semiconductor device as set forth in claim 19, further comprising a via conductive element which is formed at a side of said conductive element, said via conductive element is insulated from said conductive element.

25. A semiconductor device comprising:
a semiconductor substrate: and
a conductive element formed on said semiconductor substrate;

wherein said conductive element includes a broad portion and remaining portions, said broad portion is formed to have a wider width than those of the remaining portions of said conductive element, said remaining portions include an L-shaped portion, said conductive element being opened only at said remaining portions when a predetermined current flows, wherein said broad portion and said remaining portions are formed on the same layer, wherein said semiconductor device further includes a second conductive element formed above said conductive element and a third conductive element formed below said conductive element, wherein said second conductive element and said third conductive element are insulated from said conductive element, wherein heat is generated in a vicinity of said broad portion, said heat is configured to heat said broad portion, and wherein said heat is generated by at least a portion of said remaining portions, said heat heats said broad portion due to said predetermined current that flows through said conductive element.

26. The semiconductor device as set forth in claim 25, wherein said conductive element further includes a current input terminal and a current output terminal, said broad portion being formed between said current input terminal and said L-shaped portion.

27. The semiconductor device as set forth in claim 25, wherein said broad portion is formed substantially in the center of said conductive element.

28. The semiconductor device as set forth in claim 25, wherein said conductive element is constituted of a material mainly including copper, a poly-silicon including impurities, SiGe (silicon germanium), or silicide.

29. The device as claimed in claim 25, wherein at least two of said remaining portions are substantially U-shaped and said broad portion is between said at least two remaining portions.

30. The semiconductor device as set forth in claim 25, further comprising a via conductive element which is formed at a side of said conductive element, said via conductive element is insulated from said conductive element.

31. A semiconductor device comprising:
a semiconductor substrate; and a conductive element formed on said semiconductor substrate and only being opened when a predetermined current flows through said conductive element;

wherein said conductive element includes a broad portion and remaining portions, said remaining portions include an L-shaped portion, said broad portion is formed to have a wider width than those of the remaining portions of said conductive element, a width of entirety of said broad portion in a direction vertical to a direction of current flow through the broad portion being substantially constant, wherein said broad portion and said remaining portions are formed on the same layer, wherein said semiconductor device further includes a second conductive element formed above said conductive element and a third conductive element formed below said conductive element, wherein said second conductive element and said third conductive element are insulated from said conductive element, wherein heat is generated in a vicinity of said broad portion, said heat is configured to heat said broad portion, and wherein said heat is generated by at least a portion of said remaining portions, said heat heats said broad portion due to said predetermined current that flows through said conductive element.

32. The semiconductor device as set forth in claim 30, wherein said conductive element further includes a current input terminal and a current output terminal, said broad portion being formed between said current input terminal and said L-shaped portion.

33. The semiconductor device as set forth in claim 30, wherein said broad portion is formed substantially in the center of said conductive element.

34. The semiconductor device as set forth in claim 30, wherein said broad portion is rectangular.

35. The semiconductor device as set forth in claim 30, wherein said conductive element is constituted of a material mainly including copper, a poly-silicon including impurities, SiGe (silicon germanium), or silicide.

36. The semiconductor device as set forth in claim 30, further comprising a via conductive element which is formed at a side of said conductive element, said via conductive element is insulated from said conductive element.

* * * * *